United States Patent
Eid et al.

(10) Patent No.: US 11,234,343 B2
(45) Date of Patent: Jan. 25, 2022

(54) THERMAL MANAGEMENT SOLUTIONS FOR STACKED INTEGRATED CIRCUIT DEVICES USING UNIDIRECTIONAL HEAT TRANSFER DEVICES

(71) Applicant: Intel Corporation, Santa Clara, CA (US)

(72) Inventors: Feras Eid, Chandler, AZ (US); Adel Elsherbini, Chandler, AZ (US); Johanna Swan, Scottsdale, AZ (US)

(73) Assignee: Intel Corporation, Santa Clara, CA (US)

( * ) Notice: Subject to any disclaimer, the term of this patent is extended or adjusted under 35 U.S.C. 154(b) by 753 days.

(21) Appl. No.: 15/970,420

(22) Filed: May 3, 2018

(65) Prior Publication Data

US 2019/0343017 A1  Nov. 7, 2019

(51) Int. Cl.
*H05K 7/20* (2006.01)
*H01L 25/065* (2006.01)
(Continued)

(52) U.S. Cl.
CPC ..... *H05K 7/20263* (2013.01); *H01L 23/3675* (2013.01); *H01L 23/427* (2013.01);
(Continued)

(58) Field of Classification Search
CPC ........... H05K 7/20263; H05K 7/20281; H05K 7/20309; H05K 7/20318; H01L 25/0657;
(Continued)

(56) References Cited

U.S. PATENT DOCUMENTS

| 6,014,313 | A | 1/2000 | Hesselbom |
| 2006/0042825 | A1* | 3/2006 | Lu ................. F28D 15/0266 174/252 |

(Continued)

FOREIGN PATENT DOCUMENTS

WO  2015076050  5/2015

OTHER PUBLICATIONS

International Search Report and Written Opinion for PCT Application No. PCT/US19/25649, dated Jul. 19, 2019, 12 pgs.
(Continued)

*Primary Examiner* — Victor A Mandala
(74) *Attorney, Agent, or Firm* — Essential Patents Group, LLP.

(57) ABSTRACT

An integrated circuit structure may be formed having a first integrated circuit device, a second integrated circuit device electrically coupled to the first integrated circuit device, and at least one unidirectional heat transfer device between the first integrated circuit device and the second integrated circuit device. In one embodiment, the unidirectional heat transfer device may be oriented such that it has a higher conductivity in the direction of heat transfer from the first integrated circuit device to the second integrated circuit device than it does in the opposite direction. When the temperature of the second integrated circuit device rises above the temperature of the first integrated circuit device, the unidirectional heat transfer device will act as a thermal insulator, and when the temperature of the first integrated circuit device rises above the temperature of the second integrated circuit device, the unidirectional heat transfer device will act as a thermal conductor.

18 Claims, 5 Drawing Sheets

(51) Int. Cl.
  *H01L 23/427* (2006.01)
  *H01L 23/367* (2006.01)
  *H01L 23/00* (2006.01)
(52) U.S. Cl.
  CPC .......... *H01L 24/17* (2013.01); *H01L 25/0657* (2013.01); *H05K 7/20281* (2013.01); *H05K 7/20309* (2013.01); *H05K 7/20318* (2013.01)
(58) Field of Classification Search
  CPC ... H01L 23/427; H01L 23/3675; H01L 24/17; H01L 2224/81399; H01L 2224/05599; H01L 2224/13111; H01L 2224/2919; H01L 2224/81207; H01L 24/13; H01L 24/29; H01L 24/81; H01L 2224/81815; H01L 2224/81203; H01L 2224/81205; H01L 2924/16152; H01L 2924/15174; H01L 2224/32014; H01L 24/32; H01L 24/33; H01L 2224/33181; H01L 24/16; H01L 24/73; H01L 2924/14; H01L 2224/73203; H01L 2224/16145; H01L 2224/32145; H01L 2224/17181; H01L 2224/73253; H01L 2225/06513; H01L 2225/06517; H01L 2225/06589; H01L 2224/73204; H01L 2224/16225; H01L 2224/32225; H01L 23/367; H01L 23/3677
  See application file for complete search history.

(56) References Cited

U.S. PATENT DOCUMENTS

| | | | |
|---|---|---|---|
| 2010/0132923 | A1 | 6/2010 | Batty et al. |
| 2012/0152545 | A1* | 6/2012 | Takeda ................. E21B 47/017 166/302 |
| 2013/0051039 | A1* | 2/2013 | Min ...................... F21V 23/006 362/396 |
| 2014/0247556 | A1* | 9/2014 | Eid ..................... H01L 23/3675 361/700 |
| 2016/0174416 | A1 | 6/2016 | Sinha et al. |
| 2017/0092561 | A1* | 3/2017 | Eid ..................... H01L 23/3675 |
| 2018/0247989 | A1* | 8/2018 | An ...................... H01L 27/3276 |
| 2018/0332736 | A1* | 11/2018 | Moison .............. H05K 7/20263 |
| 2019/0206764 | A1* | 7/2019 | Kulkarni ............. H01L 23/3675 |
| 2019/0393131 | A1* | 12/2019 | Eid ..................... H01L 25/0652 |
| 2019/0393192 | A1* | 12/2019 | Eid ......................... H01L 25/50 |
| 2019/0393193 | A1* | 12/2019 | Eid ...................... H01L 23/373 |
| 2020/0305270 | A1* | 9/2020 | Kim ................... H05K 7/20336 |

OTHER PUBLICATIONS

International Preliminary Report on Patentability for PCT Application No. PCT/US19/25649, dated Nov. 12, 2020.

\* cited by examiner

THERMAL MANAGEMENT SOLUTIONS FOR STACKED INTEGRATED CIRCUIT DEVICES USING UNIDIRECTIONAL HEAT TRANSFER DEVICES

TECHNICAL FIELD

Embodiments of the present description generally relate to the removal of heat from integrated circuit devices, and, more particularly, to thermal management solutions wherein at least one unidirectional heat transfer device is utilized between stacked integrated circuit devices.

BACKGROUND

Higher performance, lower cost, increased miniaturization, and greater packaging density of integrated circuits within integrated circuit devices are ongoing goals of the electronics industry. As these goals are achieved, the integrated circuit devices become smaller. Accordingly, the density of power consumption of electronic components within the integrated circuit devices has increased, which, in turn, increases the average junction temperature of the integrated circuit device. If the temperature of the integrated circuit device becomes too high, the integrated circuits may be damaged or destroyed. This issue becomes even more critical when multiple integrated circuit devices are incorporated in a stacked configuration. As will be understood to those skilled in the art, when multiple integrated circuit devices are stacked, some of the integrated circuit devices will be "internally" positioned between an adjacent integrated circuit device and a substrate to which the stacked integrated circuit devices are attached or will be positioned between a pair of adjacent integrated circuit devices. As such, these internally positioned integrated circuit devices are isolated from thermal management solutions, such as heat spreaders, since the integrated circuit devices and/or the substrate to which the integrated circuit devices may be adjacent, are generally not efficient thermal conductors. Thus, the internally positioned integrated circuit devices may exceed their temperature limits and be damaged or destroyed, leading to the failure of the entire integrated circuit package.

BRIEF DESCRIPTION OF THE DRAWINGS

The subject matter of the present disclosure is particularly pointed out and distinctly claimed in the concluding portion of the specification. The foregoing and other features of the present disclosure will become more fully apparent from the following description and appended claims, taken in conjunction with the accompanying drawings. It is understood that the accompanying drawings depict only several embodiments in accordance with the present disclosure and are, therefore, not to be considered limiting of its scope. The disclosure will be described with additional specificity and detail through use of the accompanying drawings, such that the advantages of the present disclosure can be more readily ascertained, in which:

DESCRIPTION OF EMBODIMENTS

Figure 1:
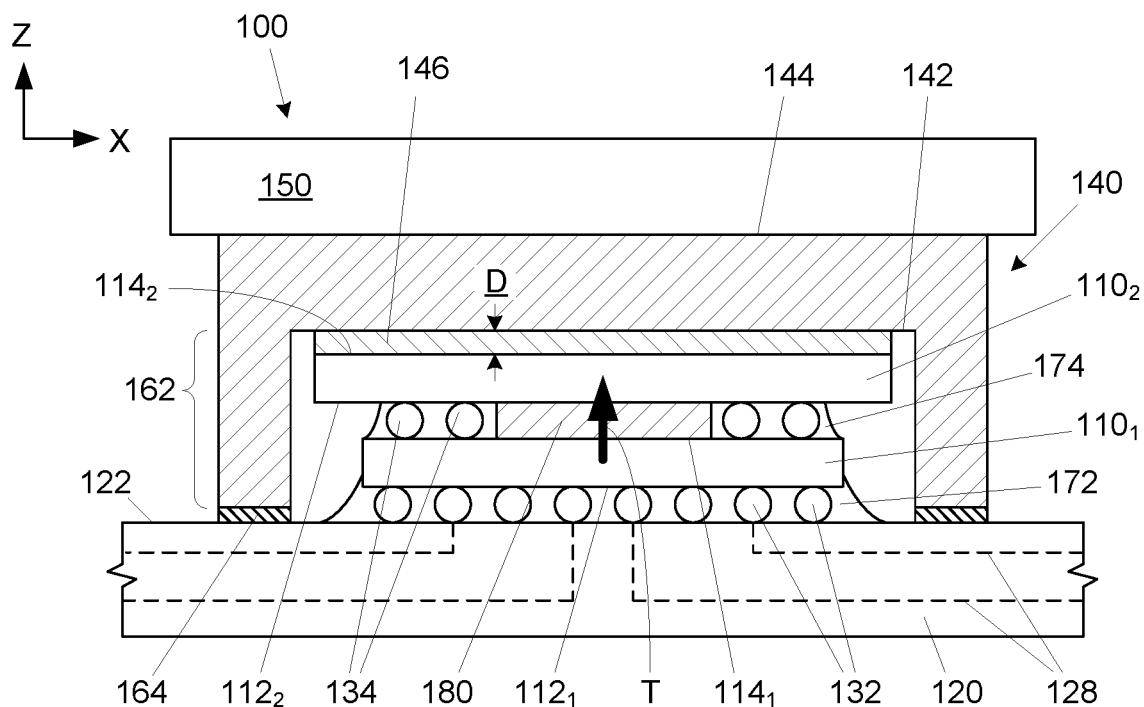
FIG. 1 is a side cross-sectional view of an integrated circuit structure having stacked integrated circuit devices with a unidirectional heat transfer device between two of the integrated circuit devices, according to an embodiment of the present description.

In the following detailed description, reference is made to the accompanying drawings that show, by way of illustration, specific embodiments in which the claimed subject matter may be practiced. These embodiments are described in sufficient detail to enable those skilled in the art to practice the subject matter. It is to be understood that the various embodiments, although different, are not necessarily mutually exclusive. For example, a particular feature, structure, or characteristic described herein, in connection with one embodiment, may be implemented within other embodiments without departing from the spirit and scope of the claimed subject matter. References within this specification to "one embodiment" or "an embodiment" mean that a particular feature, structure, or characteristic described in connection with the embodiment is included in at least one implementation encompassed within the present invention. Therefore, the use of the phrase "one embodiment" or "in an embodiment" does not necessarily refer to the same embodiment. In addition, it is to be understood that the location or arrangement of individual elements within each disclosed embodiment may be modified without departing from the spirit and scope of the claimed subject matter. The following detailed description is, therefore, not to be taken in a limiting sense, and the scope of the subject matter is defined only by the appended claims, appropriately interpreted, along with the full range of equivalents to which the appended claims are entitled. In the drawings, like numerals refer to the same or similar elements or functionality throughout the several views, and that elements depicted therein are not necessarily to scale with one another, rather individual elements may be enlarged or reduced in order to more easily comprehend the elements in the context of the present description.

The terms "over", "to", "between" and "on" as used herein may refer to a relative position of one layer with respect to other layers. One layer "over" or "on" another layer or bonded "to" another layer may be directly in contact with the other layer or may have one or more intervening layers. One layer "between" layers may be directly in contact with the layers or may have one or more intervening layers.

The term "package" generally refers to a self-contained carrier of one or more dice, where the dice are attached to the package substrate, and may be encapsulated for protection, with integrated or wire-boned interconnects between the dice and leads, pins or bumps located on the external portions of the package substrate. The package may contain a single die, or multiple dice, providing a specific function. The package is usually mounted on a printed circuit board for interconnection with other packaged integrated circuits and discrete components, forming a larger circuit.

Here, the term "cored" generally refers to a substrate of an integrated circuit package built upon a board, card or wafer comprising a non-flexible stiff material. Typically, a small printed circuit board is used as a core, upon which integrated circuit device and discrete passive components may be soldered. Typically, the core has vias extending from one side to the other, allowing circuitry on one side of the core to be coupled directly to circuitry on the opposite side of the core. The core may also serve as a platform for building up layers of conductors and dielectric materials.

Here, the term "coreless" generally refers to a substrate of an integrated circuit package having no core. The lack of a core allows for higher-density package architectures. as the through-vias have relatively large dimensions and pitch compared to high-density interconnects.

Here, the term "land side", if used herein, generally refers to the side of the substrate of the integrated circuit package closest to the plane of attachment to a printed circuit board, motherboard, or other package. This is in contrast to the term "die side", which is the side of the substrate of the integrated circuit package to which the die or dice are attached.

Here, the term "dielectric" generally refers to any number of non-electrically conductive materials that make up the structure of a package substrate. For purposes of this disclosure, dielectric material may be incorporated into an integrated circuit package as layers of laminate film or as a resin molded over integrated circuit dice mounted on the substrate.

Here, the term "metallization" generally refers to metal layers formed over the dielectric material of the package substrate. The metal layers are generally patterned to form metal structures such as traces and bond pads. The metallization of a package substrate may be confined to a single layer or in multiple layers separated by layers of dielectric.

Here, the term "bond pad" generally refers to metallization structures that terminate integrated traces and vias in integrated circuit packages and dies. The term "solder pad" may be occasionally substituted for "bond pad" and carries the same meaning.

Here, the term "solder bump" generally refers to a solder layer formed on a bond pad. The solder layer typically has a round shape, hence the term "solder bump".

Here, the term "substrate" generally refers to a planar platform comprising dielectric and metallization structures. The substrate mechanically supports and electrically couples one or more IC dies on a single platform, with encapsulation of the one or more IC dies by a moldable dielectric material. The substrate generally comprises solder bumps as bonding interconnects on both sides. One side of the substrate, generally referred to as the "die side", comprises solder bumps for chip or die bonding. The opposite side of the substrate, generally referred to as the "land side", comprises solder bumps for bonding the package to a printed circuit board.

Here, the term "assembly" generally refers to a grouping of parts into a single functional unit. The parts may be separate and are mechanically assembled into a functional unit, where the parts may be removable. In another instance, the parts may be permanently bonded together. In some instances, the parts are integrated together.

Throughout the specification, and in the claims, the term "connected" means a direct connection, such as electrical, mechanical, or magnetic connection between the things that are connected, without any intermediary devices.

The term "coupled" means a direct or indirect connection, such as a direct electrical, mechanical, magnetic or fluidic connection between the things that are connected or an indirect connection, through one or more passive or active intermediary devices.

The term "circuit" or "module" may refer to one or more passive and/or active components that are arranged to cooperate with one another to provide a desired function. The term "signal" may refer to at least one current signal, voltage signal, magnetic signal, or data/clock signal. The meaning of "a," "an," and "the" include plural references. The meaning of "in" includes "in" and "on."

The vertical orientation is in the z-direction and it is understood that recitations of "top", "bottom", "above" and "below" refer to relative positions in the z-dimension with the usual meaning. However, it is understood that embodiments are not necessarily limited to the orientations or configurations illustrated in the figure.

The terms "substantially," "close," "approximately," "near," and "about," generally refer to being within +/−10% of a target value (unless specifically specified). Unless otherwise specified the use of the ordinal adjectives "first," "second," and "third," etc., to describe a common object, merely indicate that different instances of like objects to which are being referred and are not intended to imply that the objects so described must be in a given sequence, either temporally, spatially, in ranking or in any other manner.

For the purposes of the present disclosure, phrases "A and/or B" and "A or B" mean (A), (B), or (A and B). For the purposes of the present disclosure, the phrase "A, B, and/or C" means (A), (B), (C), (A and B), (A and C), (B and C), or (A, B and C).

Views labeled "cross-sectional", "profile" and "plan" correspond to orthogonal planes within a cartesian coordinate system. Thus, cross-sectional and profile views are taken in the x-z plane, and plan views are taken in the x-y plane. Typically, profile views in the x-z plane are cross-sectional views. Where appropriate, drawings are labeled with axes to indicate the orientation of the figure.

Embodiments of the present description may include an integrated circuit structure comprising a first integrated circuit device, a second integrated circuit device electrically coupled to the first integrated circuit device, and at least one unidirectional heat transfer device between the first integrated circuit device and the second integrated circuit device. In one embodiment, the unidirectional heat transfer device may be oriented such that it has a higher conductivity in the direction of heat transfer from the first integrated circuit device to the second integrated circuit device than it does in the opposite direction. When the temperature of the second integrated circuit device rises above the temperature of the first integrated circuit device, the unidirectional heat transfer device acts as a thermal insulator, and when the temperature of the first integrated circuit device rises above the temperature of the second integrated circuit device, the unidirectional heat transfer device will act as a thermal conductor.

FIG. 1 illustrates an integrated circuit package having stacked integrated circuit devices coupled with a heat dissipation structure. In the production of integrated circuit packages, integrated circuit devices are generally mounted on substrates, which provide electrical communication routes between the integrated circuit devices and/or with external components. As shown in FIG. 1, an integrated circuit package 100 may comprise a plurality of integrated circuit devices (illustrated as a first integrated circuit device $110_1$, and a second integrated circuit device $110_2$), such as microprocessors, chipsets, graphics devices, wireless devices, memory devices, application specific integrated circuits, combinations thereof, stacks thereof, or the like, attached to a substrate 120, such as an interposer, a printed circuit board, a motherboard, and the like. In one embodiment, the first integrated circuit device $110_1$ may be attached to a first surface 122 (also known as the "die side") of the substrate 120 through a plurality of interconnects 132, such as reflowable solder bumps or balls, in a configuration generally known as a flip-chip or controlled collapse chip connection ("C4") configuration. The device-to-substrate interconnects 132 may extend from bond pads (not shown) on a first surface $112_1$ of the first integrated circuit device $110_1$ and bond pads (not shown) on the first surface 122 of the substrate 120. The integrated circuit device bond pads (not shown) of the first integrated circuit device $110_1$ may be in electrical communication with circuitry (not shown) within the first integrated circuit device $110_1$. The substrate 120 may include at least one conductive route 128 extending therethrough or thereon to form electrical connections from the first integrated circuit device $110_1$ to external components (not shown).

The second integrated circuit device $110_2$ may be attached to a second surface $114_1$ of the first integrated circuit device $110_1$ through a plurality of device-to-device interconnects 134, such as reflowable solder bumps or balls, in a configuration generally known as a flip-chip or controlled collapse chip connection ("C4") configuration. The device-to-device interconnects 134 may extend from bond pads (not shown) on a first surface $112_2$ of the second integrated circuit device $110_2$ and bond pads (not shown) on the second surface $114_1$ of the first integrated circuit device $110_1$. The bond pads (not shown) on the second surface $114_1$ of the first integrated circuit device $110_1$ may be in electrical communication with integrated circuitry (not shown) and/or through-silicon vias (not shown) within the first integrated circuit device $110_1$. The bond pads (not shown) on the first surface $112_2$ of the second integrated circuit device $110_2$ may be in electrical communication with integrated circuitry (not shown) within the second integrated circuit device $110_2$.

The substrate 120 may be primarily composed of an appropriate dielectric material, including, but not limited to, bismaleimide triazine resin, fire retardant grade 4 material, polyimide materials, glass reinforced epoxy matrix material, and the like, as well as laminates or multiple layers thereof. The substrate conductive routes 128, also known as metallization, may be composed of any conductive material, including but not limited to metals, such as copper and aluminum, and alloys thereof. As will be understood to those skilled in the art, the substrate conductive routes 128 may be formed as a plurality of conductive traces (not shown) formed on layers of dielectric material (constituting the dielectric material of the substrate 120), which are connected by conductive vias (not shown). Furthermore, the substrate 120 may be either a cored or a coreless substrate.

The device-to-substrate interconnects 132 and the device-to-device interconnects 134 can be made of any appropriate material, including, but not limited to, solders materials. The solder materials may be any appropriate material, including, but not limited to, lead/tin alloys, such as 63% tin/37% lead solder, and high tin content alloys (e.g. 90% or more tin), such as tin/bismuth, eutectic tin/silver, ternary tin/silver/copper, eutectic tin/copper, and similar alloys. When the first integrated circuit device $110_1$ is attached to the substrate 120 with device-to-substrate interconnects 132 made of solder and/or when the second integrated circuit device $110_2$ is attached to the first integrated circuit device $110_1$ with the device-to-device interconnects 134 made of solder, the solder is reflowed, either by heat, pressure, and/or sonic energy to secure the solder therebetween.

As further illustrated in FIG. 1 and according to one embodiment of the present description, a heat dissipation device 140, such as a heat spreader, may be thermally coupled with a second surface $114_2$ (opposing the first surface $112_2$) of the second integrated circuit device $110_2$. In one embodiment, the heat dissipation device 140 may have a first surface 142 and an opposing second surface 144, wherein the first surface 142 of the heat dissipation device 140 is thermally coupled to the second surface $114_2$ of the second integrated circuit device $110_2$ with a thermal interface material 146, such as a grease or polymer, to facilitate heat transfer therebetween. The heat dissipation device 140 may be made of any appropriate thermally conductive material, including, but not limited to at least one metal material and alloys of more than one metal. In one embodiment, the heat dissipation device 140 may comprise copper, nickel, aluminum, alloys thereof, laminated metals including coated materials (such as nickel coated copper), and the like.

As further shown in FIG. 1, the second surface 144 of the heat dissipation device 140 may be in thermal contact with an active heat removal device 150 (shown as a generic block), including but not limited to a heat pipe, a high surface area dissipation structure with a fan (such as a structure having fins or pillars/columns formed in a thermally conductive structure), a liquid cooling device, and the like, which removes heat from the heat dissipation device 140, as will be understood to those skilled in the art.

In one embodiment of the present description, the heat dissipation device 140 may include at least one footing 162 extending between the first surface 142 of the heat dissipation device 140 and the first surface 122 of the substrate 120, wherein the heat dissipation device footing 162 may be attached to the first surface 122 of the substrate 120 with an attachment adhesive or sealant layer 164. As illustrated in FIG. 1, the heat dissipation device 140 may be a single material throughout, such as when the heat dissipation device 140 including the heat dissipation device footing 162 is formed by a single process step, including but not limited to stamping, skiving, molding, and the like. In various embodiments, the heat dissipation device footing 162 may be a plurality of walls, pillars, or the like, or may be a single "picture frame" structure surrounding the first integrated circuit device $110_1$ and the second integrated circuit device $110_2$. The attachment adhesive or sealant layer 164 may be any appropriate material, including, but not limited to, silicones (such as polydimethylsiloxane), epoxies, and the like. It is understood that the heat dissipation device footing 162 not only secures the heat dissipation device 140 to the substrate 120, but also maintains a desired distance D between the first surface 142 of the heat dissipation device 140 and the second surface $114_2$ of the second integrated circuit devices $110_2$. This distance D may be referred to as the "bond line thickness".

It is further understood that a first underfill material 172, such as an epoxy material, may be disposed between the first surface 112₁ of the integrated circuit device 110₁ and the first surface 122 of the substrate 120, and may surround the plurality of device-to-substrate interconnects 132. A second underfill material 174, such as an epoxy material, may be disposed between the second surface 114₁ of the first integrated circuit device 110₁ and the first surface 112₂ of the second integrated circuit device 110₂, and may surround the plurality of device-to-device interconnects 134. The first underfill material 172 and the second underfill material 174 may provide structural integrity and may prevent contamination, as will be understood to those skilled in the art.

As shown in FIG. 1, at least one unidirectional heat transfer device 180 may be formed or positioned between the second surface 114₁ of the first integrated circuit device 110₁ and the first surface 112₂ of the second integrated circuit device 110₂. For the purposes of the present description, the term "unidirectional heat transfer device" is defined to mean a device or structure that has a greater thermal conductivity (k) in one direction than in its opposing direction. Thus, when the unidirectional heat transfer device is placed between a first object and a second object and is thermally oriented toward the second object from the first object, it will act in an analogous manner to an electrical diode, but in which the flowing quantity is heat instead of electrical current, e.g. a thermal diode. Thus, when the first object is hotter than the second object, heat will flow from the first object to the second object through the unidirectional heat transfer device. However, when the second object is hotter than the first object, little to no heat will flow from the second object to the first object through the unidirectional heat transfer device. In the embodiment shown in FIG. 1, a direction of heat transfer T is oriented from the first integrated circuit device 110₁ to the second integrated circuit device 110₂.

In one embodiment of the present description, the first integrated circuit device 110₁ may have a lower temperature limit (temperature at which damage to circuitry therein may occur) than the second integrated circuit device 110₂. Thus, the second integrated circuit device 110₂ may be placed next to the heat dissipation device 140, while the first integrated circuit device 110₁ is placed next to the substrate 102, which may dissipate some of the heat generated by the first integrated circuit device 110₁. As will be understood to those skilled in the art, it is desired to maximize heat transfer away from the integrated circuit package 100, while minimizing heat transfer from the second integrated circuit device 110₂ to the first integrated circuit device 110₁ in order to prevent the first integrated circuit device 110₁ from exceeding its temperature limit. Therefore, as previously discussed, the unidirectional heat transfer device 180 may be oriented such that it has a much higher conductivity in the direction of heat transfer T from the first integrated circuit device 110₁ to the second integrated circuit device 110₂ (e.g. the +z direction) than it does in the opposite direction from the second integrated circuit device 110₂ to the first integrated circuit device 110₁ (e.g. the −z direction). Thus, when the temperature of the second integrated circuit device 110₂ rises above the temperature of the first integrated circuit device 110₁, the unidirectional heat transfer device 180 acts as a thermal insulator, preventing heat transfer from the second integrated circuit device 110₂ to the first integrated circuit device 110₁. Therefore, heat generated by the second integrated circuit device 110₂ is routed to the heat dissipation device 140 without impacting the first integrated circuit device 110₁.

If, on the other hand, the temperature of the first integrated circuit device 110₁ rises above the temperature of the second integrated circuit device 110₂, the unidirectional heat transfer device 180 will act as a thermal conductor, allowing some of the heat from the first integrated circuit device 110₁ to be routed through the second integrated circuit device 110₂ and then to the heat dissipation device 140, in addition to the heat removed from the first integrated circuit device 110₁ through the substrate 120. This ensures that heat transfer from the first integrated circuit device 110₁ is maximized without the risk of thermal cross-talk from the second integrated circuit device 110₂, as heat always travels from high to low temperature.

Figure 2:
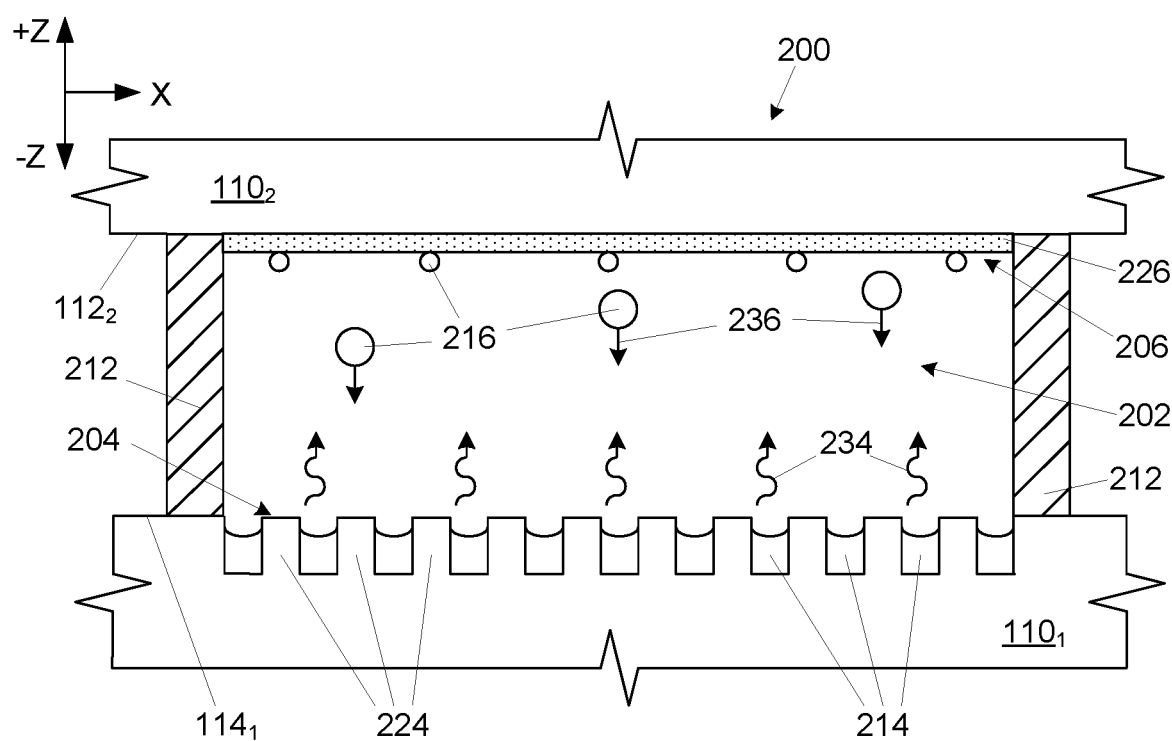
FIG. 2 is a side cross-sectional view of a unidirectional heat transfer device comprising a jumping drops vapor chamber between two integrated circuit devices, according to one embodiment of the present description.

In one embodiment shown in FIG. 2, the unidirectional heat transfer device 180 of FIG. 1 may be a jumping drops vapor chamber 200. As shown in FIG. 2, the jumping drops vapor chamber 200 may comprise a vapor space 202, which may be sealed, defined by a hydrophilic evaporation surface 204 formed on or in the second surface 114₁ of the first integrated circuit device 110₁, an opposing hydrophobic condensation surface 206 formed on the first surface 112₂ of the second integrated circuit device 110₂, and at least one sidewall 212 extending between the hydrophilic evaporation surface 204 and the hydrophobic condensation surface 206, wherein a working fluid 214 is disposed within the vapor space 202. The working fluid 214 may be any appropriate material, including, but not limited to, deionized water and dielectric liquids. It is understood that the amount of working fluid 214 within the vapor space 202 is dependent on the liquid used, the size of the vapor space 202, and various operating parameters.

As illustrated in FIG. 2, in one embodiment of the present description, the hydrophilic evaporation surface 204 may include projections or wicks 224 to render the second surface 114₁ of the first integrated circuit device 110₁ hydrophilic. The projections or wicks 224 may be formed by machining the second surface 114₁ of the first integrated circuit device 110₁, including but not limited to skiving, dicing, and laser ablation. In an embodiment of the present description, the hydrophobic condensation surface 206 may be formed by coating the first surface 112₂ of the second integrated circuit device 110₂ with a hydrophobic layer 226, such as a self-assembled monolayer material, including but not limited to thiols or silanes. As such self-assembled monolayers are only a few nanometers thick, they may have a negligible impact on thermal conductivity. In a specific embodiment, the hydrophobic layer 226 may be formed by depositing silver nanoparticles on the first surface 112₂ of the second integrated circuit device 110₂ by electroless galvanic deposition followed by a monolayer coating of 1-hexadecanethiol.

In operation, as shown in FIG. 2, the working fluid 214 evaporates at the hydrophilic evaporation surface 204 when the integrated circuit device 110₁ heats up. The evaporated working fluid 214 flows to the hydrophobic condensation surface 206 (shown by waving lines 234). At the hydrophobic condensation surface 206, when it is cooler than the hydrophilic evaporation surface 204, the working fluid 214 condenses, which transports the heat away from the first integrated circuit device 110₁. When drops 216 of the working fluid 214 reach a specific size and coalesce, the excess surface energy released from the coalescence propels the working fluid drops 216 to spontaneously jump (shown by lines 236) back to the hydrophilic evaporation surface 204, independent of gravity, providing a return path for an evaporation/condensation cycle, as will be understood by those skilled in the art. The jumping drops chamber only acts as a conductor in the +z direction (when the temperature of the integrated circuit device $110_1$ is greater than that of the integrated circuit device $110_2$), while it acts as an insulator in the −z direction (when the temperature of the integrated circuit device $110_2$ is greater than that of the integrated circuit device $110_1$).

The jumping drops vapor chamber 200 differs from traditional vapor chambers in that traditional vapor chambers rely on capillary action for liquid return, requiring relatively long wicks to allow for the large working fluid flow rates that are necessary for cooling. However, relatively long wicks have a high thermal resistance, which reduces the overall thermal conductivity of the traditional vapor chamber. In jumping drops vapor chambers 200, the capillary limit of traditional vapor chambers is surpassed because the return is achieved by the jumping action previously described. The projections or wicks 224 of the hydrophilic evaporation surface 204 are now only used for capturing the returning working fluid drops 216, and, thus, can be made much shorter and finer than wicks in a traditional vapor chambers. This may lead to much higher thermal conductivities of the jumping drops vapor chamber 200 in the +z direction compared to traditional vapor chambers. Moreover, the finer projections or wicks 224 may allow higher heat flux before boiling incipiency and may expand the range of allowable heat fluxes before dry-out occurs, as will be understood to those skilled in the art. Furthermore, as will also be understood to those skilled in the art, the first integrated circuit device $110_1$ may have specific areas that are hotter than other areas during operation, known as hot spot areas. The jumping drops vapor chamber 200 may act to dynamically mitigate such hot spots areas due to the fact that the evaporation rate of the working fluid 214 will be higher in hot spot areas than other areas, leading to fast temperature uniformity without requiring any special designs for the hot spot areas.

In one embodiment of the present description, the jumping drops vapor chamber sidewalls 212 may comprise a seal, such as an O-ring. As will be understood to those skilled in the art, various commercial O-rings or other such materials are available that may be able to withstand the temperature and humidity of the proposed environment. In an embodiment, the jumping drops vapor chamber sidewalls 212 may be compliant to absorb manufacturing tolerances or assembly tilt, as will be understood to those skilled in the art.

Figure 3:
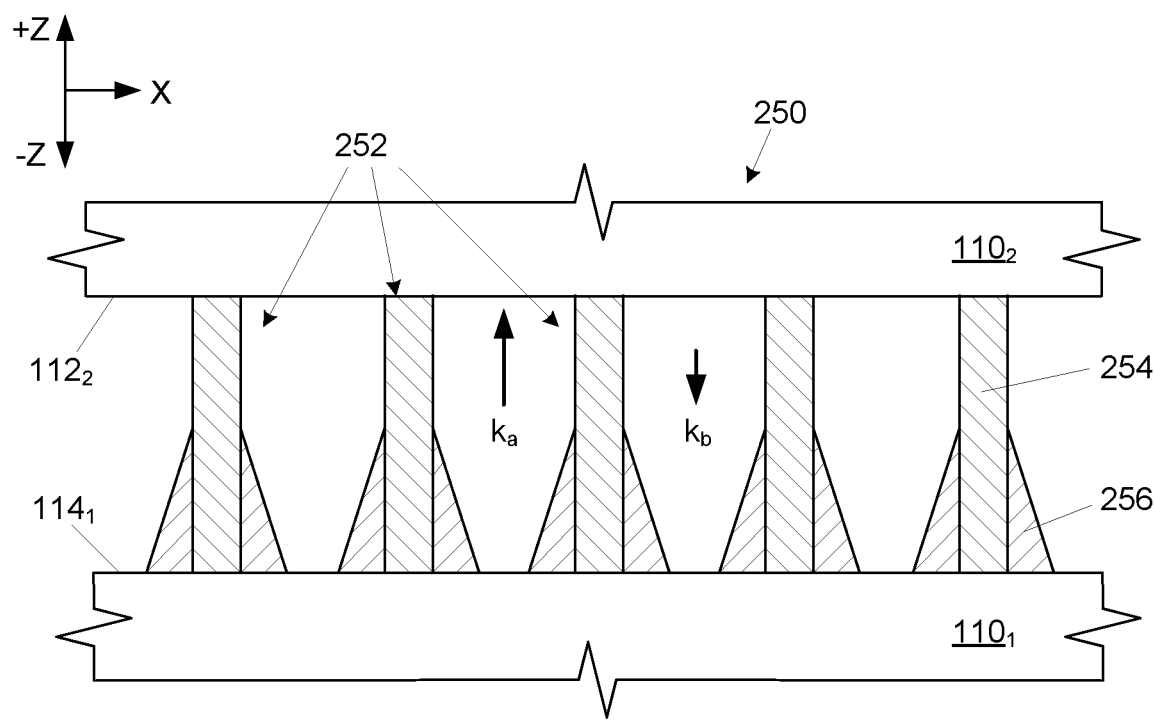
FIG. 3 is a side cross-sectional view of a unidirectional heat transfer device comprising a mass-loaded heat transfer device between two integrated circuit devices, according to another embodiment of the present description.

In another embodiment shown in FIG. 3, the unidirectional heat transfer device 180 of FIG. 1 may be a directionally mass-loaded structure 250, as shown in FIG. 3. The directionally mass-loaded structure 250 may comprise a plurality of mass-loaded elements 252. Each of the mass-loaded elements 252 may comprise highly thermally conductive rods, tubes, or bundles thereof, hereinafter collectively referred to as "thermally conductive structures 254", extending from the second surface $114_1$ of the first integrated circuit device $110_1$ to the first surface $112_2$ of the second integrated circuit device $110_2$ and a mass loading material 256 near the second surface $114_1$ of the first integrated circuit device $110_1$. The directionally mass-loaded structure 250 has a greater heat flow in the direction of decreasing mass density of the mass-loaded elements 252. In other words, the directionally mass-loaded structure 250 have a substantially higher thermal conductivity $k_a$ in the +z-direction (e.g. in the direction from the first integrated circuit device $110_1$ to the second integrated circuit device $110_2$) than a thermal conductivity kb in the −z-direction (e.g. in the direction from the second integrated circuit device $110_2$ to the first integrated circuit device $110_1$).

In one embodiment, the thermally conductive structures 254 may comprise carbon nanotubes. In another embodiment, the thermally conductive structures 254 may comprise boron nitride nanotubes. In a further embodiment, the mass loading material 256 may comprise a relatively heavy molecular material, such as trimethyl-cyclopentadienyl platinum ($C_9H_{16}Pt$).

In one embodiment, the mass loading material 256 may be axially oriented with a non-uniform distribution about the thermally conductive structures 254. In an embodiment, the mass loading material 256 may be substantially conical about each thermally conductive structure 254, wherein the widest part of the mass loading material 256 is proximate the second surface $114_1$ of the first integrated circuit device $110_1$. In one embodiment, the mass loading material 256 tapers toward the thermally conductive structures 254 and gets narrower (in x-y cross-sectional area (e.g. y direction (not shown) extends perpendicular to the plane formed by the x direction and z direction)) as the vertical distance (in the z direction) away from the second surface $114_1$ of the first integrated circuit device $110_1$ increases. The processes for the fabrication of the plurality of mass-loaded elements 252 are well known in the art and for purposes of brevity and conciseness will not be described herein.

Figure 4:
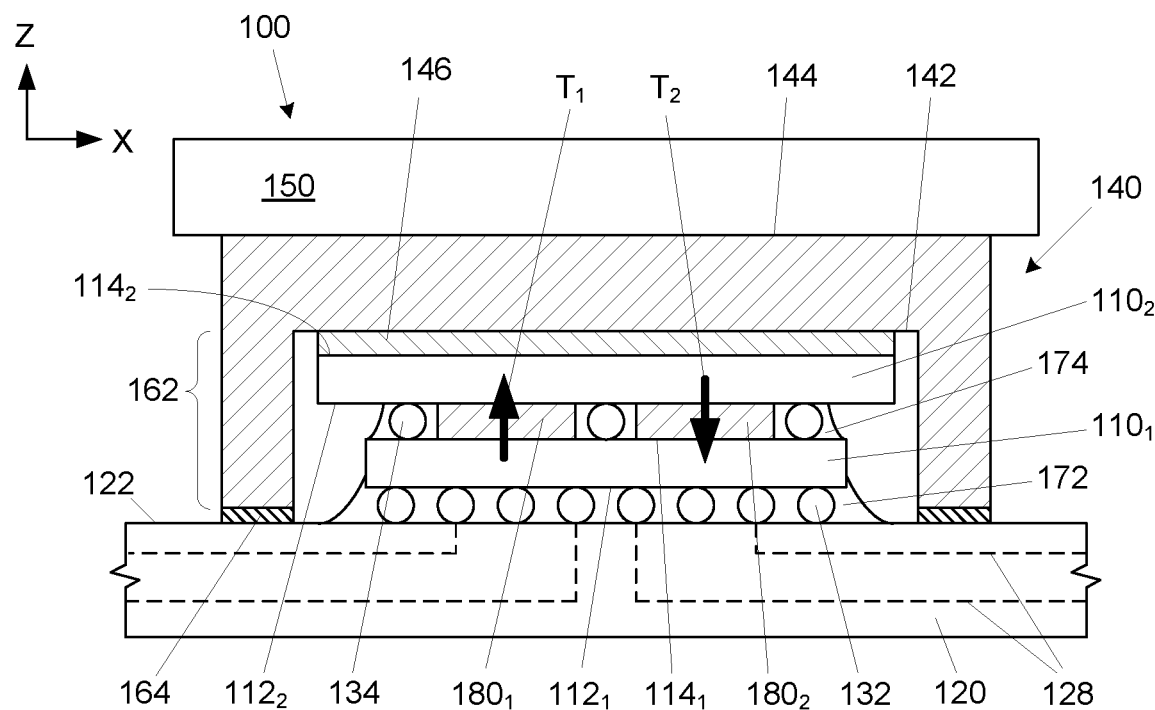
FIG. 4 is a side cross-sectional view of an integrated circuit structure having stacked integrated circuit devices with one unidirectional heat transfer device between two of the integrated circuit devices that transfers heat in one direction and another unidirectional heat transfer device between two of the integrated circuit devices that transfers heat in an opposite direction, according to an embodiment of the present description.

It is understood that the embodiments of the present description are not limited to a single unidirectional heat transfer device 180 or a single direction of heat transfer T in the orientation of all of the unidirectional heat transfer devices 180. As shown in FIG. 4, more than one unidirectional heat transfer device (shown as first unidirectional heat transfer device $180_1$ and second unidirectional heat transfer device $180_2$) may be formed between the first integrated circuit device $110_1$ and the second integrated circuit device $110_2$. Furthermore, the first unidirectional heat transfer device $180_1$ may have a direction of heat transfer $T_1$ oriented from the first integrated circuit device $110_1$ to the second integrated circuit device $110_2$, whereas the second unidirectional heat transfer device $180_2$ may have a direction of heat transfer $T_2$ oriented from the second integrated circuit device $110_2$ to the first integrated circuit device $110_1$ (e.g. opposite thermal polarities). This can be advantageous if either the first integrated circuit device $110_1$ or the second integrated circuit device $110_2$, or both, have regions (not shown) with different temperature limits and/or different power densities, where it is desirable to limit thermal cross-talk in a certain heat transfer direction in some regions (not shown) and in the opposite heat transfer direction in other regions (not shown).

Figure 5:
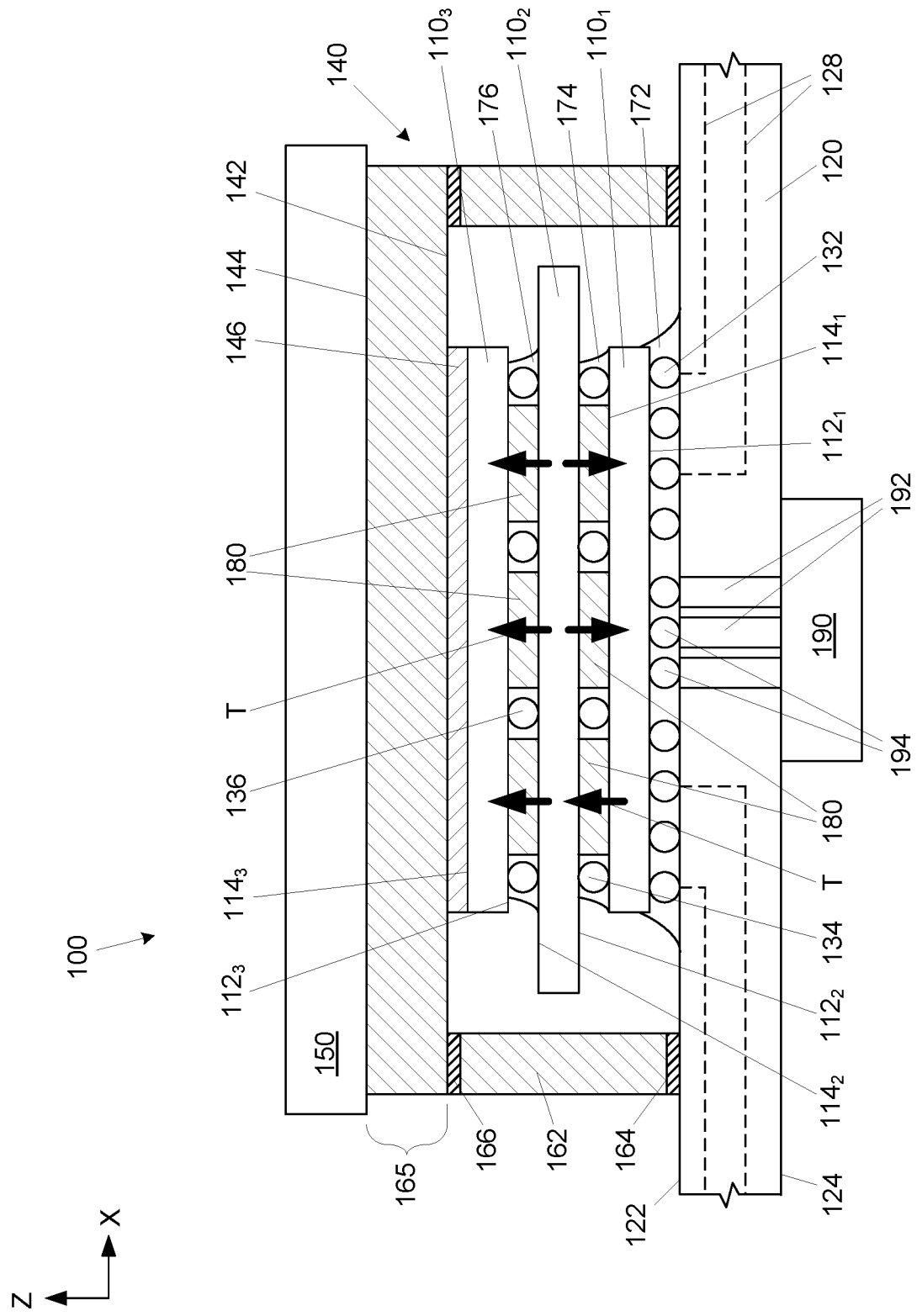
FIG. 5 is a side cross-sectional view of a stacked integrated circuit package having a plurality of unidirectional heat transfer devices having various positions and heat transfer direction orientations, according to another embodiment of the present description.

It is further understood that the embodiments of the present description are neither limited to the number of integrated circuit devices nor limited to a specific heat dissipation configuration. The integrated circuit package 100 may have a variety of configurations for utilizing the embodiments of the unidirectional heat transfer devices 180, $180_1$, $180_2$ of the present description. As shown in FIG. 5, at least one additional or third integrated circuit device $110_3$ may be incorporated into the integrated circuit package 100. For example, the third integrated circuit device $110_3$ may be attached to the second surface $114_2$ of the second integrated circuit device $110_2$ through a plurality of additional device-to-device interconnects 136, such as reflowable solder bumps or balls, in a configuration generally known as a flip-chip or controlled collapse chip connection ("C4") configuration. The additional device-to-device interconnects 136 may extend from bond pads (not shown) on a first surface $112_3$ of the third integrated device $110_3$ and bond pads (not shown) on the second surface $114_2$ of the second integrated circuit device $110_2$. The bond pads (not shown) on the second surface $114_2$ of the second integrated circuit device $110_2$ may be in electrical communication with integrated circuitry (not shown) or through-silicon vias (not shown) within the second integrated circuit device $110_2$. The bond pads (not shown) on a first surface $112_3$ of the third integrated circuit device $110_3$ may be in electrical communication with integrated circuitry (not shown) within the third integrated circuit device $110_3$. As still further shown in FIG. 5, at least one unidirectional heat transfer device 180 may be formed between the second surface $114_2$ of the second integrated circuit device $110_2$ and the first surface $112_3$ of the third integrated circuit device $110_3$. The unidirectional heat transfer device 180 may have any appropriate heat transfer direction T (collectively). It is further understood that a third underfill material 176, such as an epoxy material, may be disposed between the third integrated circuit device $110_3$ and the second integrated circuit device $110_2$, and surround the plurality of additional device-to-device interconnects 136.

As further shown in FIG. 5, in some applications, it may be desired to increase heat transfer from the first integrated circuit device $110_1$ through the substrate 120. This may be achieved by adding thermal bumps 194 (not carrying electrical signals, but merely fabricated to transfer heat) between the first surface $112_1$ of the integrated circuit device $110_1$ and the first surface 122 of the substrate 120, and incorporating high thermal conductivity structures 192, such as thermal vias, metal slugs, and the like, in the substrate 120. The high thermal conductivity structures 192 may extend from the first surface 122 of the substrate 120 to an opposing second surface 124 (also known as "land side") of the substrate 120. The high thermal conductivity structures 192 may be thermally coupled to an additional heat dissipation device 190 mounted on the second surface 124 of the substrate 120. The additional heat dissipation device 190 may be passive, such as a heat slug, or active, such as a heat pipe, as will be understood to those skilled in the art.

Although the heat dissipation device 140 illustrated in FIG. 1 shows the heat dissipation device footing 162 as a single material, the embodiments of the present description are not so limited. As also shown in FIG. 5, in further embodiments of the present description, the heat dissipation device 140 may consist of at least two parts, wherein a main portion 165 of the heat dissipation device 140 and the at least one heat dissipation device footing 162 are separate parts. As shown, the heat dissipation device footing 162 may be attached to the first surface 142 of the heat dissipation device 140 with an adhesive or sealant layer 166. Although fabricating the heat dissipation device 140 as a multiple piece assembly will take additional assembly steps, it may make the fabrication of the heat dissipation device 140 easier, as a whole. The heat dissipation device footing 162 may be a plurality of walls, pillars, or the like, or may be a single "picture frame" structure surrounding the integrated circuit devices $110_1$, $110_2$, and $110_3$. The adhesive or sealant layer 166 may be any appropriate material, including, but not limited to silicones (such as polydimethylsiloxane), epoxies, and the like. In one embodiment, the adhesive or sealant layer 166 may be the same as the attachment adhesive or sealant layer 164.

Figure 6:
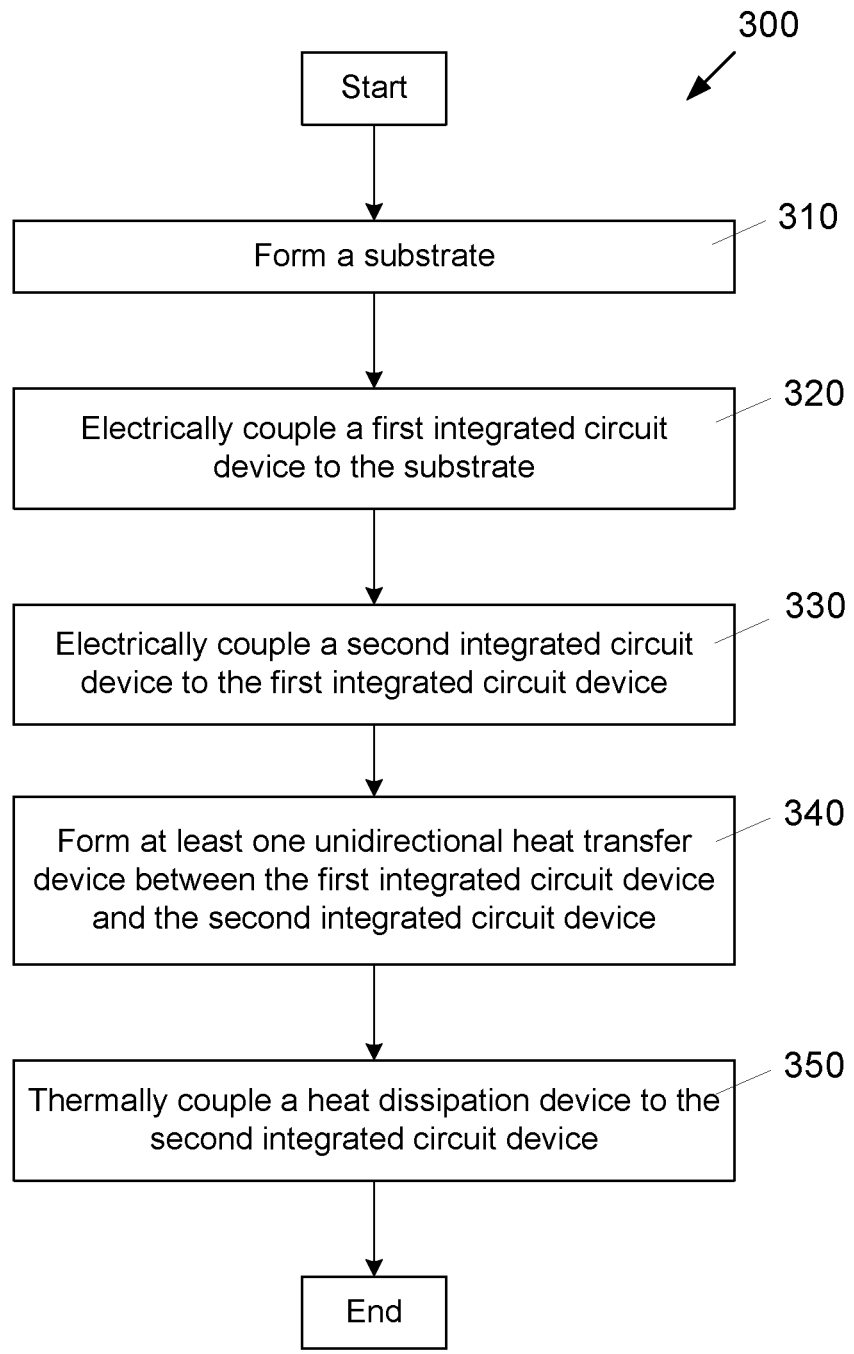
FIG. 6 is a flow chart of a process for fabricating an electronic system including an integrated circuit structure having integrated circuit devices stacked on a substrate with a unidirectional heat transfer device between two of the integrated circuit devices, according to one embodiment of the present description.

FIG. 6 is a flow chart of a process 300 of fabricating an integrated circuit structure according to an embodiment of the present description. As set forth in block 310, a substrate may be formed. A first integrated circuit device may be electrically coupled to the substrate, as set forth in block 320. As set forth in block 330, a second integrated circuit device may be electrically coupled to the first integrated circuit device. At least one unidirectional heat transfer device may be formed between the first integrated circuit device and the second integrated circuit device, as set forth in block 340. As set forth in block 350, a heat dissipation device may be thermally coupled to the second integrated circuit device.

Figure 7:
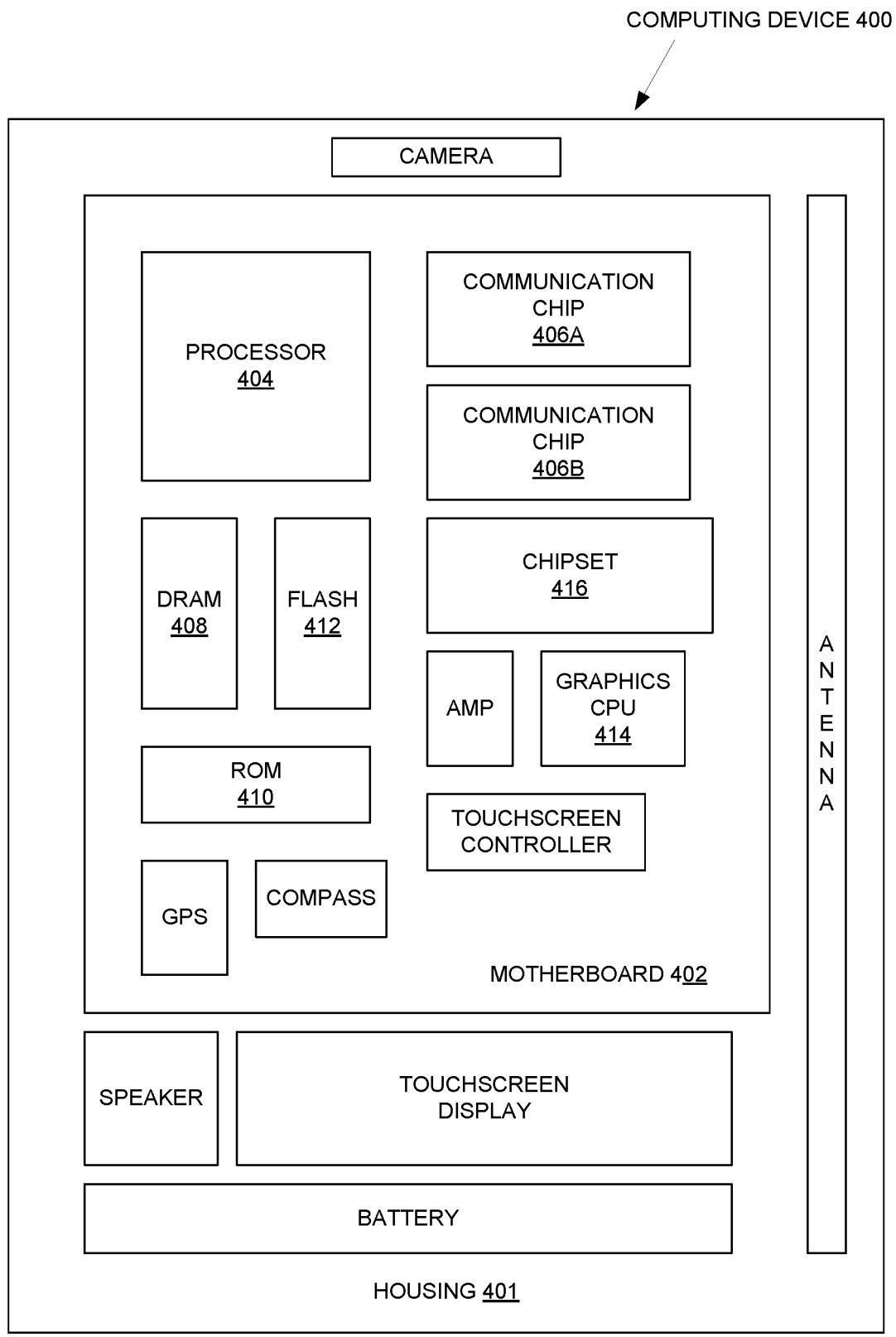
FIG. 7 is an electronic device/system, according to an embodiment of the present description.

FIG. 7 illustrates an electronic or computing device 400 in accordance with one implementation of the present description. The computing device 400 may include a housing 401 having a board 402 disposed therein. The board 402 may include a number of integrated circuit components, including but not limited to a processor 404, at least one communication chip 406A, 406B, volatile memory 408 (e.g., DRAM), non-volatile memory 410 (e.g., ROM), flash memory 412, a graphics processor or CPU 414, a digital signal processor (not shown), a crypto processor (not shown), a chipset 416, an antenna, a display (touchscreen display), a touchscreen controller, a battery, an audio codec (not shown), a video codec (not shown), a power amplifier (AMP), a global positioning system (GPS) device, a compass, an accelerometer (not shown), a gyroscope (not shown), a speaker, a camera, and a mass storage device (not shown) (such as hard disk drive, compact disk (CD), digital versatile disk (DVD), and so forth). Any of the integrated circuit components may be physically and electrically coupled to the board 402. In some implementations, at least one of the integrated circuit components may be a part of the processor 404.

The communication chip enables wireless communications for the transfer of data to and from the computing device. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device may include a plurality of communication chips. For instance, a first communication chip may be dedicated to shorter range wireless communications such as Wi-Fi and Bluetooth and a second communication chip may be dedicated to longer range wireless communications such as GPS, EDGE, GPRS, CDMA, WiMAX, LTE, Ev-DO, and others.

The term "processor" may refer to any device or portion of a device that processes electronic data from registers and/or memory to transform that electronic data into other electronic data that may be stored in registers and/or memory.

At least one of the integrated circuit components may include an integrated circuit structure thermal solution comprising a first integrated circuit device, a second integrated circuit device stacked on the first integrated circuit device, and at least one unidirectional heat transfer element between the first integrated circuit device and the second integrated circuit device.

In various implementations, the computing device may be a laptop, a netbook, a notebook, an ultrabook, a smartphone, a tablet, a personal digital assistant (PDA), an ultra-mobile PC, a mobile phone, a desktop computer, a server, a printer, a scanner, a monitor, a set-top box, an entertainment control unit, a digital camera, a portable music player, or a digital video recorder. In further implementations, the computing device may be any other electronic device that processes data.

It is understood that the subject matter of the present description is not necessarily limited to specific applications illustrated in FIGS. 1-7. The subject matter may be applied to other integrated circuit devices and assembly applications, as well as any appropriate electronic application, as will be understood to those skilled in the art.

Having thus described in detail embodiments of the present invention, it is understood that the invention defined by the appended claims is not to be limited by particular details set forth in the above description, as many apparent variations thereof are possible without departing from the spirit or scope thereof

What is claimed is:

1. An integrated circuit structure, comprising:
a first integrated circuit device;
a second integrated circuit device electrically coupled to the first integrated circuit device; and
at least one unidirectional heat transfer device between the first integrated circuit device and the second integrated circuit device, wherein the at least one unidirectional heat transfer device comprises one of a jumping drops vapor chamber and a directionally mass-loaded structure.

2. An integrated circuit structure, comprising:
a first integrated circuit device;
a second integrated circuit device electrically coupled to the first integrated circuit device; and
at least one unidirectional heat transfer device between the first integrated circuit device and the second integrated circuit device, wherein the at least one unidirectional heat transfer device comprises a first unidirectional heat transfer device thermally oriented from the first integrated circuit device to the second integrated circuit device and a second unidirectional heat transfer device thermally oriented from the second integrated circuit device to the first integrated circuit device.

3. An integrated circuit package, comprising:
a substrate;
a first integrated circuit device electrically coupled to the substrate;
a second integrated circuit device electrically coupled to the first integrated circuit device; and
at least one unidirectional heat transfer device between the first integrated circuit device and the second integrated circuit device, wherein the at least one unidirectional heat transfer device comprises one of a jumping drops vapor chamber and a directionally mass-loaded structure.

4. An integrated circuit package, comprising:
a substrate;
a first integrated circuit device electrically coupled to the substrate;
a second integrated circuit device electrically coupled to the first integrated circuit device; and
at least one unidirectional heat transfer device between the first integrated circuit device and the second integrated circuit device, wherein the at least one unidirectional heat transfer device comprises a first unidirectional heat transfer device thermally oriented from the first integrated circuit device to the second integrated circuit device and a second unidirectional heat transfer device thermally oriented from the second integrated circuit device to the first integrated circuit device.

5. An integrated circuit package, comprising:
a substrate;
a first integrated circuit device electrically coupled to the substrate;
a second integrated circuit device electrically coupled to the first integrated circuit device;
at least one unidirectional heat transfer device between the first integrated circuit device and the second integrated circuit device; and
a heat dissipation device thermally coupled to the second integrated circuit device.

6. The integrated circuit package of claim 5, wherein the heat dissipation device includes at least one footing and wherein the at least one footing is attached to the substrate.

7. The integrated circuit package of claim 5, further including an active heat removal device thermally coupled to the heat dissipation device.

8. An integrated circuit package, comprising:
a substrate;
a first integrated circuit device electrically coupled to the substrate;
a second integrated circuit device electrically coupled to the first integrated circuit device;
at least one unidirectional heat transfer device between the first integrated circuit device and the second integrated circuit device; and
high thermal conductivity structures extending through the substrate, wherein the high thermal conductivity structures are thermally coupled to the first integrated circuit device.

9. The integrated circuit package of claim 8, further comprising an additional heat dissipation device thermally coupled to the high thermal conductivity structures.

10. The integrated circuit package of claim 8, further comprising thermal bumps thermally coupling the high thermal conductivity structures to the first integrated circuit device.

11. An electronic system, comprising:
a housing;
a board in the housing;
a first integrated circuit device electrically coupled to the board;
a second integrated circuit device electrically coupled to the first integrated circuit device; and
at least one unidirectional heat transfer device between the first integrated circuit device and the second integrated circuit device, wherein the at least one unidirectional heat transfer device comprises one of a jumping drops vapor chamber and a directionally mass-loaded structure.

12. An electronic system, comprising:
a housing;
a board in the housing;
a first integrated circuit device electrically coupled to the board;
a second integrated circuit device electrically coupled to the first integrated circuit device; and
at least one unidirectional heat transfer device between the first integrated circuit device and the second integrated circuit device, wherein the at least one unidirectional heat transfer device comprises a first unidirectional heat transfer device thermally oriented from the first integrated circuit device to the second integrated circuit device and a second unidirectional heat transfer device thermally oriented from the second integrated circuit device to the first integrated circuit device.

13. An electronic system, comprising:
a housing;
a board in the housing;
a first integrated circuit device electrically coupled to the board;
a second integrated circuit device electrically coupled to the first integrated circuit device;
at least one unidirectional heat transfer device between the first integrated circuit device and the second integrated circuit device; and
a heat dissipation device thermally coupled to the second integrated circuit device.

14. The electronic system of claim 13, wherein the heat dissipation device includes at least one footing and wherein the at least one footing is attached to the board.

15. The electronic system of claim 13, further including an active heat removal device thermally coupled to the heat dissipation device.

16. An electronic system, comprising:
a housing;
a board in the housing;
a first integrated circuit device electrically coupled to the board;
a second integrated circuit device electrically coupled to the first integrated circuit device;
at least one unidirectional heat transfer device between the first integrated circuit device and the second integrated circuit device; and
high thermal conductivity structures extending through the board, wherein the high thermal conductivity structures are thermally coupled to the first integrated circuit device.

17. The electronic system of claim 16, further comprising an additional heat dissipation device thermally coupled to the high thermal conductivity structures.

18. The electronic system of claim 16, further comprising thermal bumps thermally coupling the high thermal conductivity structures to the first integrated circuit device.

* * * * *